United States Patent Office 3,825,428
Patented July 23, 1974

3,825,428

UNSATURATED POLYESTER RESIN PHOTORESIST COMPOSITION

Edmund Benjamin Davidson, Yardley, Pa., assignor to RCA Corporation

No Drawing. Filed Aug. 7, 1972, Ser. No. 278,263
Int. Cl. G03c *1/68, 1/70*
U.S. Cl. 96—91 N 5 Claims

ABSTRACT OF THE DISCLOSURE

A photoresist composition comprising an unsaturated polyester resin such as an unsaturated alkyd resin polymer which has been reacted with an alkoxysilane and a free radical initiator, to increase its speed of response. A sensitizer is also preferably included in the composition.

BACKGROUND

Photoresists are substances that are resistant to the action of certain solvents and are also light sensitive in that exposure to some form of actinic radiation causes them to at least partially change chemically from one to the other of two alternative forms, one of which is resistant to certain solvents and the other of which is soluble in those solvents.

Most photoresists change from a soluble to an insoluble form when they are exposed to light. These are known as "negative" photoresists. The areas of photoresist remaining after development of an image are those that have been exposed to light.

A negative type photoresist that has been found particularly useful in manufacturing integrated electronic circuits because of its excellent adherence to silicon dioxide films and also to metals such as tungsten, chromium and gold is one made from an oil-modified unsaturated alkyd resin as described in U.S. Pat. 3,615,952 issued Oct. 26, 1971 to Edmund B. Davidson. This material also has good speed of response to actinic radiation.

However, in the manufacture of monolithic integrated circuits, there is a tendency toward incorporation of still smaller circuit elements and it is necessary to have photoresist materials that will permit better resolution in order to define these smaller elements. It is known that better resolution can be obtained using an electron beam to expose the photoresist, because of the shorter wavelengths involved. However, it has been found desirable to have photoresists that are more sensitive to electron beam radiation than previously known photoresists. It has also been found desirable to have electron beam-sensitive photoresists which are more adherent to substrates such as silicon dioxide.

DESCRIPTION OF PREFERRED EMBODIMENT

Example 1

An example of an improved photoresist of the present invention can be made by selecting an unsaturated alkyd resin polymer, for example, one prepared as described in above-mentioned U.S. Pat. 3,615,952. The polymer may be prepared by reacting together:

| | Percent by wt. |
|---|---|
| Tall oil fatty acid (1% resin) | 25.0 |
| Phthalic anhydride | 35.5 |
| Pentaerythritol | 18.0 |
| Trimethylolpropane | 16.9 |
| Benzoic acid | 4.6 |

The ingredients are reacted at a temperature of about 200° C. until the product has an acid number of about 5–25. (Determined by titration of an aliquot with KOH solution.)

A 30% by weight solution of this polymer in xylene has added to it an amount of $\gamma$-mercaptopropyltrimethoxysilane (alkoxy silane) equal to 7% by weight of the polymer and an amount of azobisisobutyronitrile (free radical initiator) of up to 5% by weight of the polymer. This composition is heated for 3 hours at 100° C. After cooling, the resulting material is diluted to 20% solids with additional xylene and sensitized with 2,6-bis(p-azidobenzylidene)-4-methylcyclohexanone (or other sensitizer) in an amount equal to 6% by weight of the solids.

The improved material, made as described above, was tested as follows. A second solution was made up of the unmodified polymer prepared as described above with the same percentage of polymer solids (30% by weight in xylene) and the same amount of the sensitizer mentioned above. The two solutions were used separately to coat oxidized silicon wafers by applying the solutions to the surfaces of the wafers and spinning at 5000 r.p.m. for 40 seconds.

The wafers were then exposed through the same test mask to a 200 watt mercury lamp for 10 seconds and developed. The wafer that had been coated with the alkoxysilane modified polymer gave a strong pattern while the unmodified polymer gave no pattern.

The new material was also tested for relative sensitivity to an electron beam. For comparison purposes, a sample of the unmodified polymer, as described above, was coated on a nickel coated glass slide and exposed to rasters of an electron beam with currents of 30, 7.5, 3.0, 0.75, and $0.3\times10^{-5}$ coulombs/sq. cm. Only the first 3 rasters developed. The alkoxysilane modified polymer was coated in the same way and exposed to rasters of an electron beam with currents of 7.5, 3.0, 0.75, 0.3, 0.075, 0.03 and $0.0075\times10^{-5}$ coulombs/sq. cm. All rasters developed although the last 2 were faint. This represents an increase in sensitivity of 40 or more times that of the unmodified material.

In order to determine optimum proportions of the alkoxysilane and the azobisisobutyronitrile initiator, the following tests were run. Solutions were made up as follows:

Solution A. The polymer described in Example 1, 50% by wt. solution in xylene.

Solution B. $\gamma$-mercaptopropyltrimethoxysilane, 5 ml. diluted to 50 ml. with xylene.

Solution C. Azobisisobutyronitrile, 0.2 g. dissolved in 50 ml. of xylene.

TABLE I

| | Solution A (g.) | Solution B (ml.) | Solution C (ml.) |
|---|---|---|---|
| Sample #: | | | |
| 1 | 20 | 1 | 11.5 |
| 2 | 20 | 2.5 | 10 |
| 3 | 20 | 5 | 7.5 |
| 4 | 20 | 7.5 | 5 |
| 5 | 20 | 10 | 2.5 |
| 6 | 20 | 0 | (1) |

1 7.5+5 ml. xylene.

Each sample, which was a mixture of solutions A, B and C, was placed in its own nitrogen-flushed bottle and heated at 55° C. for 2 days. After dilution, using 20 g. of a sensitizer solution made up of 3.75 g. of 2,6-bis(p-azidobenzylidene)-4-methylcyclohexanone in 125 g. of xylene, each solution was used to coat oxidized silicone wafers.

The wafers were exposed to a pattern of light and shadow with the following results.

TABLE II

| | Exposure time | | | |
|---|---|---|---|---|
| | 7 sec. | 5 sec. | 4 sec. | 3 sec. |
| Sample #: | | | | |
| 1 | No pattern | | | |
| 2 | Weak pattern. | No pattern | | |
| 3 | Complete pattern. | Complete pattern. | Trace pattern. | |
| 4 | Strong complete pattern. | Good complete pattern. | Complete grainy pattern. | Trace pattern. |
| 5 | Stronger complete pattern than #4. | Strong complete pattern. | Complete pattern, better than #4. | More than #4 but not complete pattern. |
| 6 | No pattern | | | |

Another alkoxysilane, trimethoxysilane, was evaluated and gave the following results. The sample corresponding to #5 in Table I was made up but substituting trimethoxysilane as the silane. This composition gave a strong pattern for a 6 second exposure time.

In general, alkoxy silanes which have the capability of free radical addition to double bonds, are useful in the invention. These include materials having the general formula $HSi(OR)_nR'_{3-n}$ where R is an alkyl group having from 1–5 carbon atoms or an acyl group of 1–5 carbon atoms. R′ is an alkyl group having from 1–5 carbon atoms and $n$ is an integer from 1–3. The alkoxysilanes may also be materials having the general formula $$X(CHR'')_mSi(OR)_nR'_{3-n}$$

where X can be —SH or other group which can be added to double bonds, R″ is a simple (straight chain) alkyl group, $m$ is an integer from 1–5 and R, R′ and $n$ have meanings as defined above.

In these compositions, the azobisisobutyronitrile acts as a free radical initiator. Other well known initiators such as light, cumene hydroxide and organic peroxides such as benzoyl peroxide may also be used. The initiator may be omitted entirely since the oxygen of the air can also be used to provide free radicals. However, better control of the process is maintained if an initiator is used.

Other sensitizers may be used in these compositions such as benzoin, benzophenone, 2,3-butanedione, 4,4,4′,4′-bis (dimethylamino) benzophenone, benzoin methyl ether, 2-methylanthraquinone and 2-chloranthraquinone.

I claim:

1. A photoresist composition comprising the reaction product of an unsaturated alkyd resin polymer, an alkoxysilane having the general formula $HSi(OR)_nR'_{3-n}$ where R is either an alkyl or an acyl group having 1–5 carbon atoms, R′ is an alkyl group having 1–5 carbon atoms and $n$ is an integer from 1–3, a free radical initiator and a photosensitizer for said polymer.

2. A photoresist composition comprising the reaction product of an unsaturated alkyd resin polymer, an alkoxysilane having the general formula $$HS(CHR'')_mSi(OR)_nR'_{3-n},$$

where R″ is a simple alkyl group, R is either an alkyl or an acyl group having 1–5 carbon atoms, R′ is an alkyl group having 1–5 carbon atoms, $n$ is an integer from 1–3 and $m$ is an integer from 1–5, and a free radical initiator, and also containing a photosensitizer for said polymer.

3. A composition according to claim 2 in which said alkoxysilane is γ-mercaptopropyltrimethoxy silane.

4. A composition according to claim 3 in which said free radical initiator is azobis-isobutyronitrile.

5. A composition according to claim 4 in which said sensitizer is 2,6 - bis(p-azidobenzylidene)-4-methylcyclohexanone.

References Cited

UNITED STATES PATENTS

| | | | |
|---|---|---|---|
| 3,398,210 | 8/1968 | Plueddemann et al. | 260—827 |
| 3,615,952 | 10/1971 | Davidson | 96—44 |
| 3,702,766 | 11/1972 | Dunham et al. | 96—91 N |

RONALD H. SMITH, Primary Examiner

U.S. Cl. X.R.

96—35.1, 115 R; 204—159.19